US011354263B2

(12) United States Patent
Shiraishi et al.

(10) Patent No.: US 11,354,263 B2
(45) Date of Patent: Jun. 7, 2022

(54) BUS SYSTEM PERMITTING PARALLEL ACCESS BY A MASTER TO A PLURALITY OF SLAVES AND METHOD OF CONTROLLING THE SAME

(71) Applicant: CANON KABUSHIKI KAISHA, Tokyo (JP)

(72) Inventors: Daisuke Shiraishi, Tokyo (JP); Wataru Ochiai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 76 days.

(21) Appl. No.: 16/900,213

(22) Filed: Jun. 12, 2020

(65) Prior Publication Data

US 2020/0401545 A1 Dec. 24, 2020

(30) Foreign Application Priority Data

Jun. 19, 2019 (JP) .............................. JP2019-113919

(51) Int. Cl.
*G06F 13/40* (2006.01)
*G06F 13/16* (2006.01)
*G11C 11/4096* (2006.01)

(52) U.S. Cl.
CPC ...... *G06F 13/4031* (2013.01); *G06F 13/1668* (2013.01); *G11C 11/4096* (2013.01)

(58) Field of Classification Search
CPC .......................... G06F 13/4031; G06F 13/1668
See application file for complete search history.

(56) References Cited

U.S. PATENT DOCUMENTS

| 6,728,816 B1* | 4/2004 | Worrell ............... G06F 13/4013 710/305 |
| 8,601,191 B2* | 12/2013 | Aoki ................... G06F 13/4036 710/241 |
| 10,445,270 B2* | 10/2019 | Ulmer ................. G06F 13/3625 |
| 2002/0019895 A1* | 2/2002 | Kim ...................... G06F 13/423 710/100 |
| 2004/0225767 A1* | 11/2004 | Tsai ..................... G06F 13/1642 710/110 |
| 2007/0101032 A1* | 5/2007 | Nara ..................... G06F 13/364 710/113 |

(Continued)

FOREIGN PATENT DOCUMENTS

JP 2012073851 A 4/2012

*Primary Examiner* — Phong H Dang
(74) *Attorney, Agent, or Firm* — Rossi, Kimms & McDowell LLP

(57) ABSTRACT

A bus system comprises a master, a first slave, a second slave, and a bus. The master is configured to be able to issue a second request to the second slave after issuing a first request to the first slave and before receiving a response to the first request. The bus comprises: a determination unit configured to, upon receiving the second request, determine whether to permit a transfer of the second request to the second slave; and a suspending unit configured to suspend the transfer of the second request to the second slave while it is determined by the determination unit that the transfer is not permitted. The determination unit determines whether or not the transfer is permitted based on a notification from the first slave regarding processing of the first request.

7 Claims, 7 Drawing Sheets

(56) References Cited

U.S. PATENT DOCUMENTS

2008/0082707 A1* 4/2008 Gupta ................ G06F 13/1615
710/110
2009/0037552 A1* 2/2009 Chen .................... G06F 13/385
709/208
2019/0036874 A1* 1/2019 Sun ....................... H04L 12/403

* cited by examiner

BUS SYSTEM PERMITTING PARALLEL ACCESS BY A MASTER TO A PLURALITY OF SLAVES AND METHOD OF CONTROLLING THE SAME

BACKGROUND OF THE INVENTION

Field of the Invention

The present invention relates to bus control, and more particularly, to a technique for controlling responses from slaves in a bus that allows parallel access by a master to a plurality of slaves.

Description of the Related Art

Recently, in bus systems, split transactions which independently control a request for data transfer and a response which is the actual data transfer have been introduced. In a split transaction, the master can issue a request to a plurality of slaves in parallel, thereby enabling improvement of data-transfer efficiency. On the other hand, since the plurality of slaves that receive the request are operating independently, the timing at which each slave returns a response to the master is different. Therefore, even if it is assumed that responses to be returned in the same order as the order in which the master issued the requests (in-order), there is a risk that the responses may be returned in a different order from the order in which the requests were issued.

Therefore, in order to guarantee the order of responses, there are buses that suspend the issuance of requests to different slaves until a response to a request previously issued by the master is returned from the slave. However, the data transfer efficiency is reduced because the issuance of a next request is suspended until the response to a previous request is returned from a slave. Japanese Patent Laid-Open No. 2012-73851 (Patent Document 1) proposes a bus system that has a buffer and rearranges responses returned from slaves into an expected order.

In the technique described in Patent Document 1 described above, the order is guaranteed by rearranging the responses from the slaves into the expected order using the buffer. However, a master made in the past few years often makes a request for a large amount of data transfer in a single request, and thus the circuit size of the bus for such a master is greatly increased due to the buffer.

SUMMARY OF THE INVENTION

According to one aspect of the present invention, a bus system comprising a master, a first slave, a second slave, and a bus operable to connect the master, the first slave, and the second slave, wherein the master is configured to be able to issue a second request to the second slave after issuing a first request to the first slave and before receiving a response to the first request, the bus comprises: a determination unit configured to, upon receiving the second request, determine whether to permit a transfer of the second request to the second slave; and a suspending unit configured to suspend the transfer of the second request to the second slave while it is determined by the determination unit that the transfer is not permitted, and wherein the determination unit determines whether or not the transfer is permitted based on a notification from the first slave regarding processing of the first request.

The present invention makes it possible to guarantee the order of responses to a plurality of requests.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
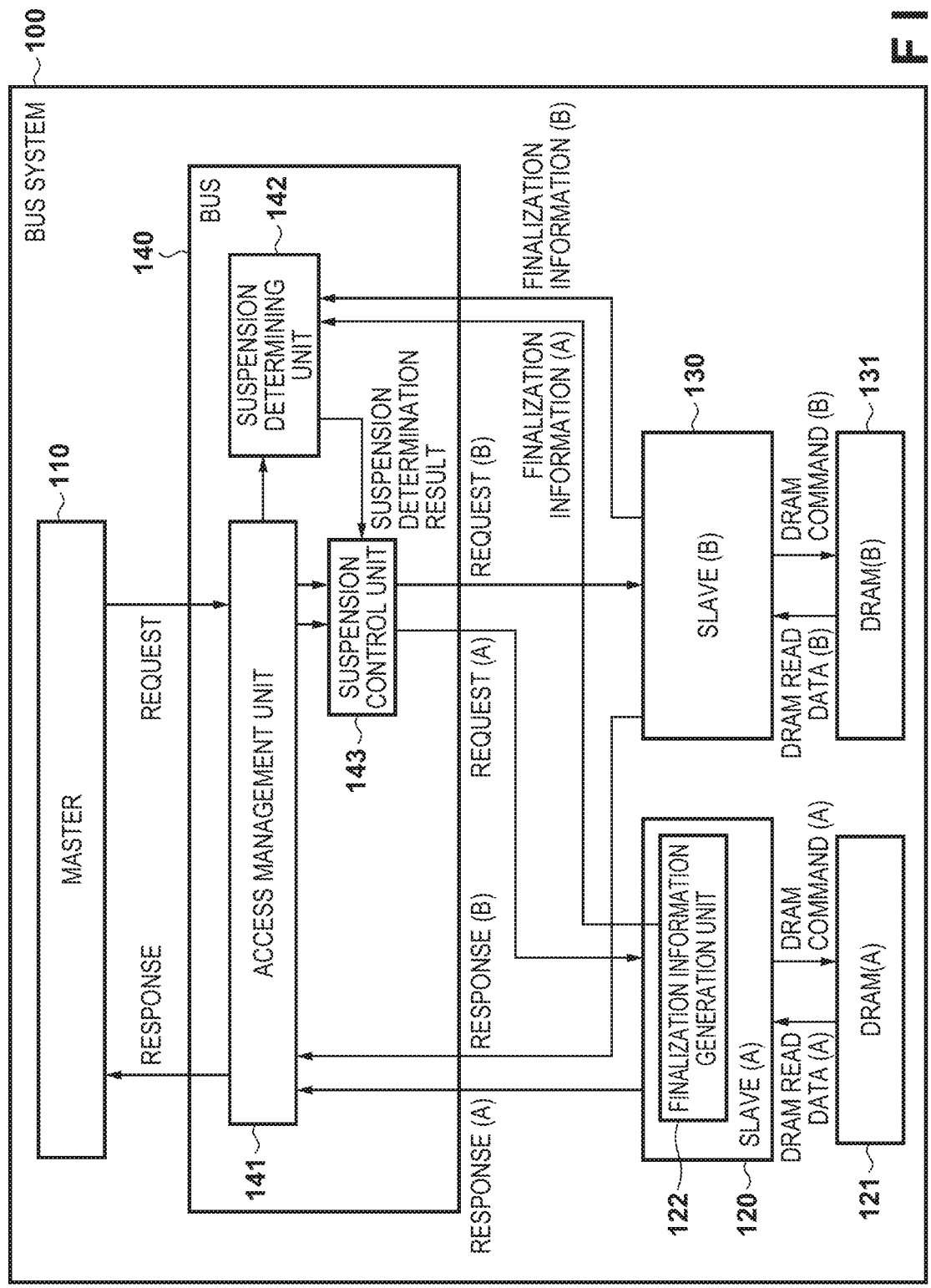
FIG. 1 is a diagram showing an overall configuration of a bus system according to a first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

As a first embodiment of the bus system according to the present invention, a bus system for accessing a DRAM will be exemplified and described below.

System Configuration

FIG. 1 is a diagram showing an overall configuration of a bus system 100 according to the first embodiment. In the bus system 100, a master 110, a slave (A) 120, and a slave (B) 130 are connected via a bus 140.

The slave (A) 120 and the slave (B) 130 are DRAM controllers, and control access to a DRAM (A) 121 and a DRAM (B) 131, respectively. Here, although the slave (A) 120 and the slave (B) are DRAM controllers, they are not limited to DRAM controller if they are slaves that process requests from the master 110 and return a response.

The master 110 issues a request to the bus 140. In the bus system 100, simultaneous (parallel) access to a plurality of slaves is allowed. That is, the master 110 is configured to be able to, after issuing a request to the slave (A) 120 and before receiving a response to this request, issue a request to the slave (B) 130. The request includes "address information", "Dir", and "transfer identifier". Here, Dir is access type information indicating whether the request is a read or a write. With respect to a plurality of responses to a plurality of requests having the same Dir and the same transfer identifier, the master 110 expects the plurality of responses to be returned in the order in which the plurality of requests were issued. Responses to other requests may be returned in any order.

The bus 140 transfers a request received from the master 110 to the slave (A) 120 or slave (B) 130 based on the address information included in the request. The slave (A) 120 and the slave (B) 130 generate DRAM commands from the requests received from the bus 140 and access the connected DRAM (A) 121 and DRAM (B) 131. When processing of the requests is completed, the slave (A) 120 and the slave (B) 130 transfer a response to the bus 140, and the bus 140 transmits the received responses to the master 110.

The bus 140 includes an access management unit 141, a suspension determining unit 142, and a suspension control unit 143.

Upon receiving a request from the master 110, the access management unit 141 decodes destination slaves from the address information included in the received request, distributes the request to each destination slave, and transfers the request to the suspension control unit 143. The access management unit 141 notifies the suspension determining unit 142 of information related to the request (request information). Here, the request information includes the decoded destination slaves, the transfer identifier, and the Dir.

Upon receiving responses from the slave (A) 120 and the slave (B) 130, the access management unit 141 transfers the received response to the master 110. The same transfer identifier as the corresponding request is assigned to the response, and the access management unit 141 notifies the suspension determining unit 142 of information related to the response (response information). Here, the request information includes the transfer identifier and the Dir.

The suspension determining unit 142 determines whether or not to suspend the transfer of the request received by the access management unit 141 to the slave based on the request information, the response information, and finalization information notified from the slave. A result of this determination is notified to the suspension control unit 143 as a suspension determination result. Details of the suspension determining unit 142 will be described later with reference to FIGS. 2 and 3.

Upon being notified from the suspension determining unit 142 to suspend the transfer of the request, the suspension control unit 143 suspends the transfer to the destination slave of the request received from the access management unit 141. Upon being notified from the suspension determining unit 142 not to suspend the transfer, the suspension control unit 143 transfers the request received from the access management unit 141 to the destination slave.

The slave (A) 120 includes a finalization information generation unit 122 that generates finalization information to be notified to the suspension determining unit 142. The finalization information generation unit 122 transmits the finalization information to the suspension determining unit 142 at a timing at which a time period until the response to the request received by the slave (A) 120 will be returned is finalized. The details of the finalization information will be described later with reference to FIG. 4.

Figure 2:
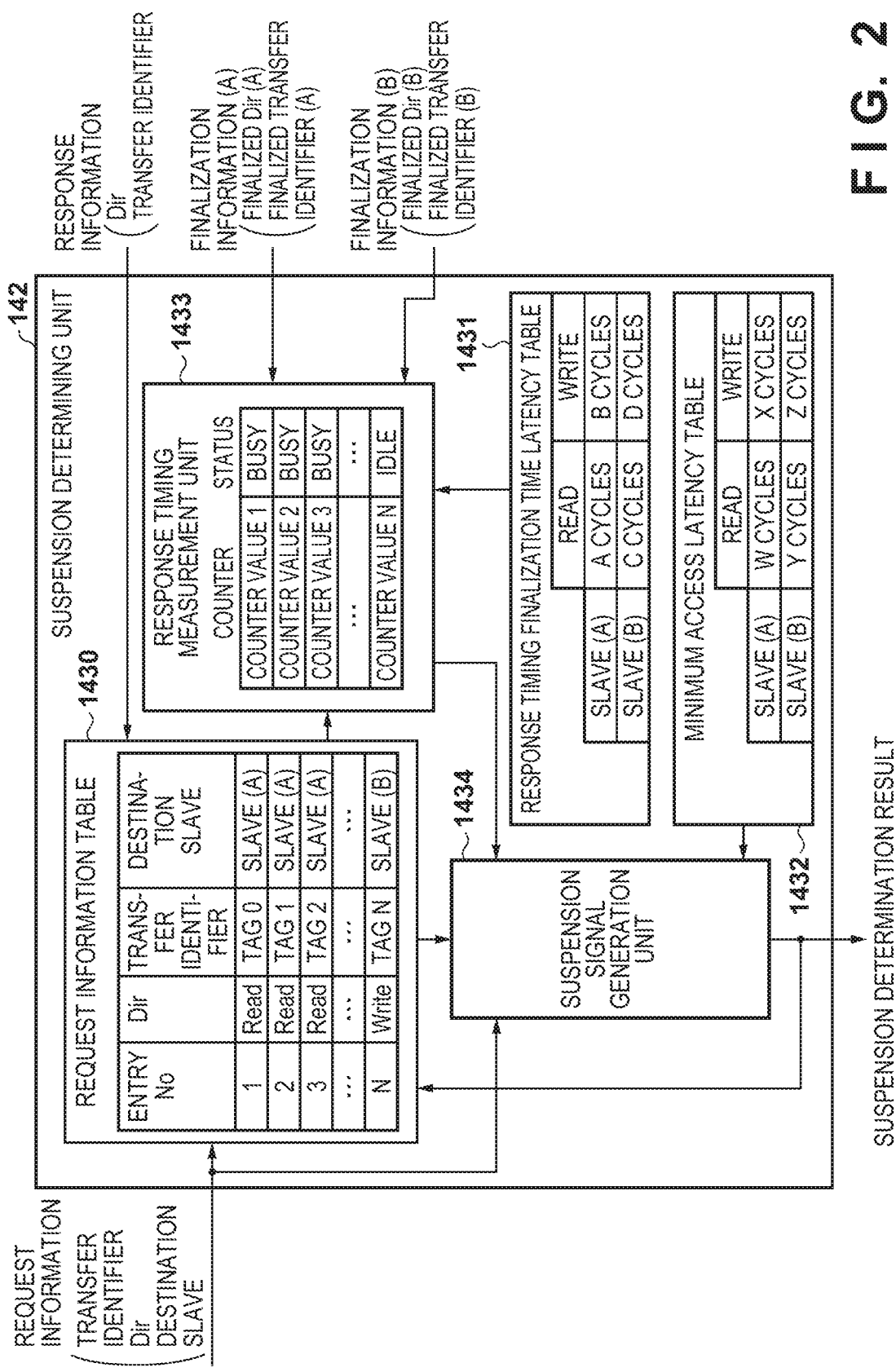
FIG. 2 is a diagram showing a configuration of a suspension determining unit.

FIG. 2 is a diagram showing a configuration of the suspension determining unit 142 in the first embodiment. The suspension determining unit 142 includes a request information table 1430, a response timing finalization time latency table 1431, and a minimum access latency table 1432. In addition, it also includes a response timing measurement unit 1433 and a suspension signal generation unit 1434.

The request information table 1430 holds request information of outstanding requests which are requests transferred to a slave for which a corresponding response has not been received from the slave. As described above, each piece of request information includes a Dir of the request, a transfer identifier, and a destination slave.

When a request corresponding to request information notified from the access management unit 141 is transferred to the destination slave, the suspension determining unit 142 registers the request information in the request information table 1430. When response information is notified to the suspension determining unit 142 from the access management unit 141, the suspension determining unit 142 deletes from the request information table 1430 the oldest entry having the same transfer identifier and Dir as the transfer identifier and Dir included in the response information.

For each slave connected to the bus 140, the response timing finalization time latency table 1431 stores a latency which is from when the slave transmits the finalization information to when the response is to be returned (response timing finalization time latency: first information). For each slave connected to the bus 140, the minimum access latency table 1432 stores a minimum latency (minimum access latency: second information) from when the transfer of the request is permitted by the suspension control unit 143 until the slave starts returning a response. Here, it is assumed that the response timing finalization time latency and the minimum access latency are held for each combination of the slave and Dir, but if there is no difference in latency due to the slave or Dir, the combinations to be held may be reduced. The response timing finalization time latency table 1431 and the minimum access latency table 1432 are stored as given information in a storage unit allocated in the suspension determining unit 142.

The response timing measurement unit 1433 manages a plurality of counters which correspond to respective entries of the request information table 1430, and the status of each counter. The response timing measurement unit 1433 searches the request information table 1430 when the finalization information is notified from the slave. Then, the oldest entry having the same transfer identifier and Dir as the transfer identifier and Dir included in the finalization information and for which the corresponding counter has a status of "IDLE" is selected. The destination slave of the corresponding entry and the response timing finalization time latency corresponding to Dir are set for the counter corresponding to the selected entry, and the counter is activated. At this time, the status of the activated counters is updated to "BUSY". The counter counts down and stops when the count value becomes "0". When an entry is deleted from the request information table 1430, the corresponding counters for that entry have their status returned to IDLE.

Operation of the Suspension Determining Unit 142

Figure 3:
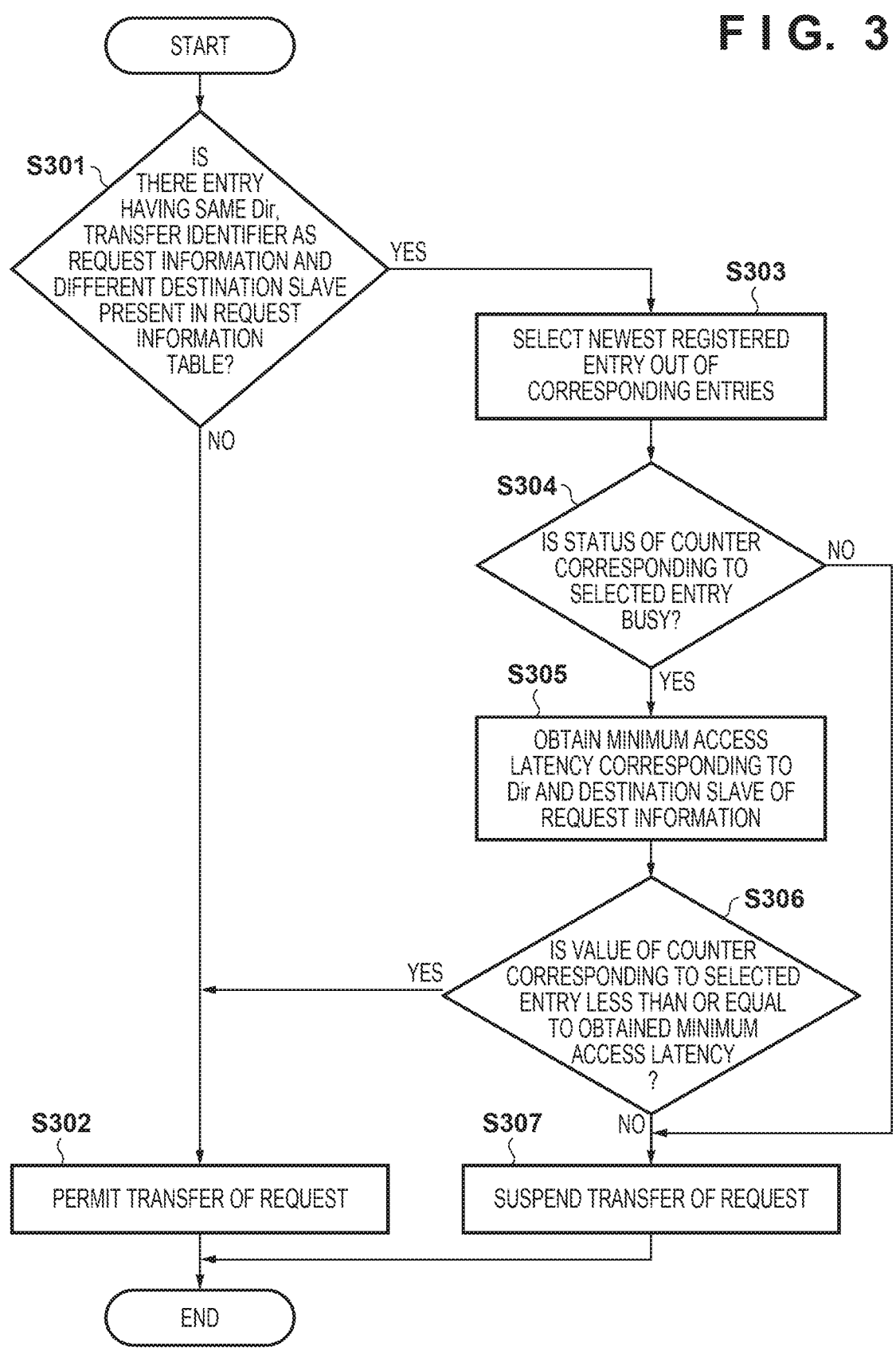
FIG. 3 is a flowchart of a request suspension determination algorithm.

FIG. 3 is a flowchart of a request suspension determination algorithm executed by the suspension determining unit 142. When request information is notified from the access management unit 141, the suspension signal generation unit 1434 makes a suspension determination regarding the transfer of the corresponding request to the destination slave, and notifies the suspension control unit 143 of the suspension determination result.

In step S301, the suspension determining unit 142 determines whether there is an entry in the request information table 1430 having the same Dir, the same transfer identifier, and a different destination slave as the notified request information. The same Dir means, for example, that both are reads of data from a DRAM, or both are writes of data to a DRAM. If there is no corresponding entry, the process proceeds to step S302; if there is a corresponding entry, the process proceed to step S303.

In step S302, the suspension determining unit 142 permits transfer of the request. Meanwhile, in step S303, the suspension determining unit 142 selects the latest registered entry among corresponding entries.

In step S304, the suspension determining unit 142 checks whether the status of the counter of the response timing measurement unit 1433 corresponding to the selected entry is "BUSY". If it is "BUSY", the process proceeds to step S305, and if it is not "BUSY", the process proceeds to step S307.

In step S305, the suspension determining unit 142 acquires the minimum access latency corresponding to the Dir and the destination slave of the request information. In step S306, the suspension determining unit 142 determines whether or not the counter value corresponding to the selected entry is less than or equal to the minimum access latency. That is, a return timing of response to a new (or subsequent) request and a return timing of a response to the selected entry are calculated and compared. It is then determined whether the return timing of a response to a new request being after a return timing of a response to the selected entry is guaranteed. If the counter value is less than or equal to the minimum access latency, the process proceeds to step S302, and if the counter value is not less than or equal to the minimum access latency, the process proceeds to step S307.

In step S307, the suspension determining unit 142 suspends transfer of the request.

Figure 4:
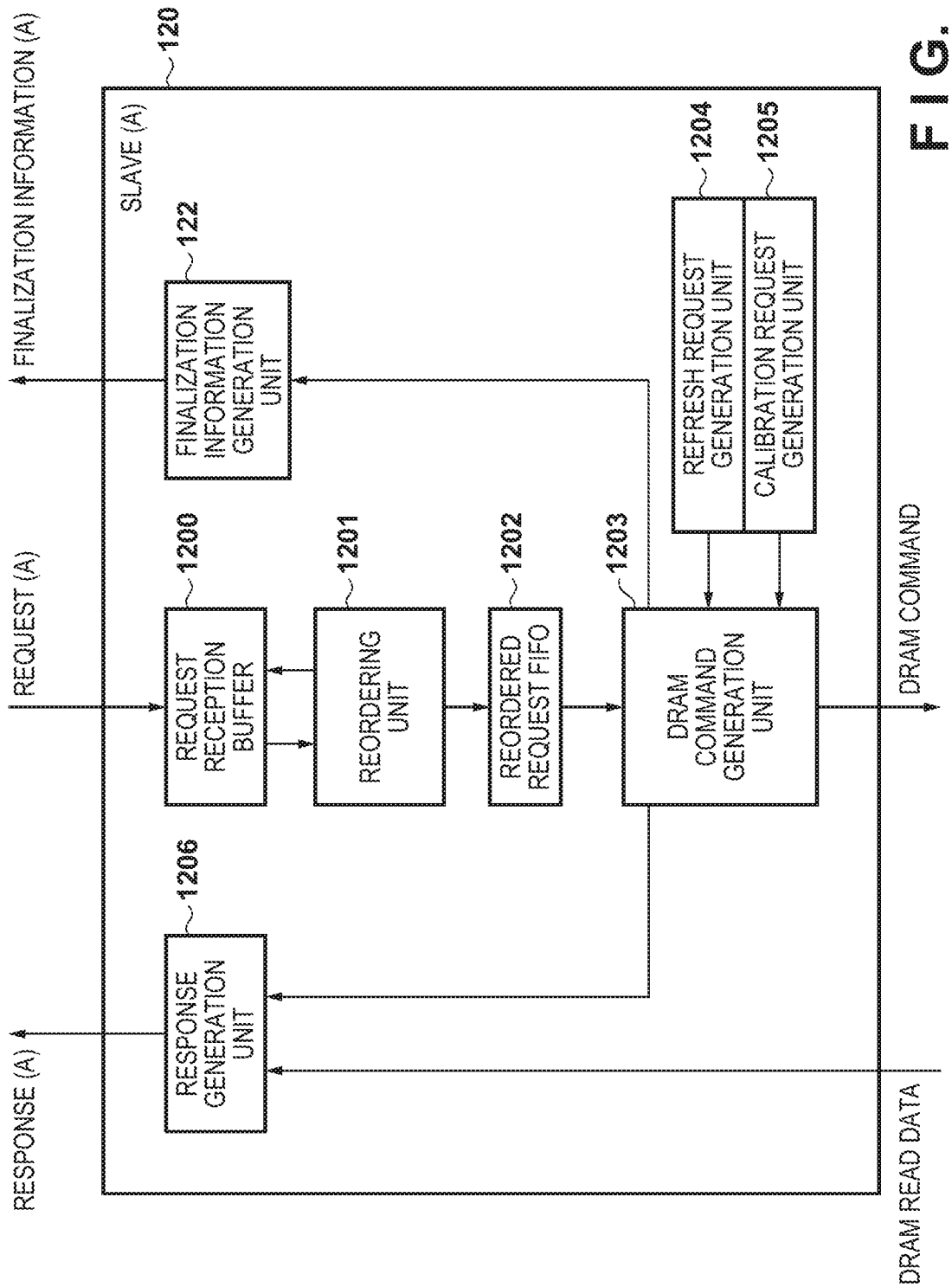
FIG. 4 is a view showing a configuration of a slave.

FIG. 4 is a view showing a configuration of a slave. Here, the configuration of the slave (A) 120 is shown.

A request reception buffer 1200 stores a request received from the bus 140. A reordering unit 1201 fetches a request stored in the request reception buffer 1200 in an order so that DRAM transfer efficiency improves and stores the request in the reordered request FIFO 1202. For this reason, the order in which requests are processed is not finalized until they are stored in the reordered request FIFO 1202.

A DRAM command generation unit 1203 generates a DRAM command from the head request of the reordered request FIFO 1202 and transmits the DRAM command to the DRAM (A) 121. The DRAM command includes an active command for controlling DRAM pages or a precharge command, and is generated depending on the state of a DRAM bank to be accessed. When the generated and transmitted DRAM command is a write command, the DRAM command generation unit 1203 requests a response generation unit 1206 to generate a write response.

A refresh request generation unit 1204 and a calibration request generation unit 1205 periodically generate a refresh request and a calibration request so that a DRAM standard is satisfied. When such a request is generated, the DRAM command generation unit 1203 transmits the refresh command or calibration command to the DRAM (A) 121 in preference to processing for a request stored in the reordered request FIFO 1202.

Upon receiving DRAM read data from DRAM (A) 121, the response generation unit 1206 generates a read response and transmits the read response to the bus 140. When generation of a write response is requested from the DRAM command generation unit 1203, a write response is generated and transmitted to the bus 140.

The finalization information generation unit 122 notifies the bus 140 of finalization information at a timing when the DRAM command generation unit 1203 transmits a DRAM read command or a DRAM write command to the DRAM (A) 121. As described above, the finalization information is notified at a timing when a time period until the response to the request is returned is finalized. Specifically, the finalization information is notified at the timing when the order in which the request is to be processed is finalized, and a command for the request is generated. The finalization information includes the transfer identifier and Dir of the corresponding request.

Figure 5:
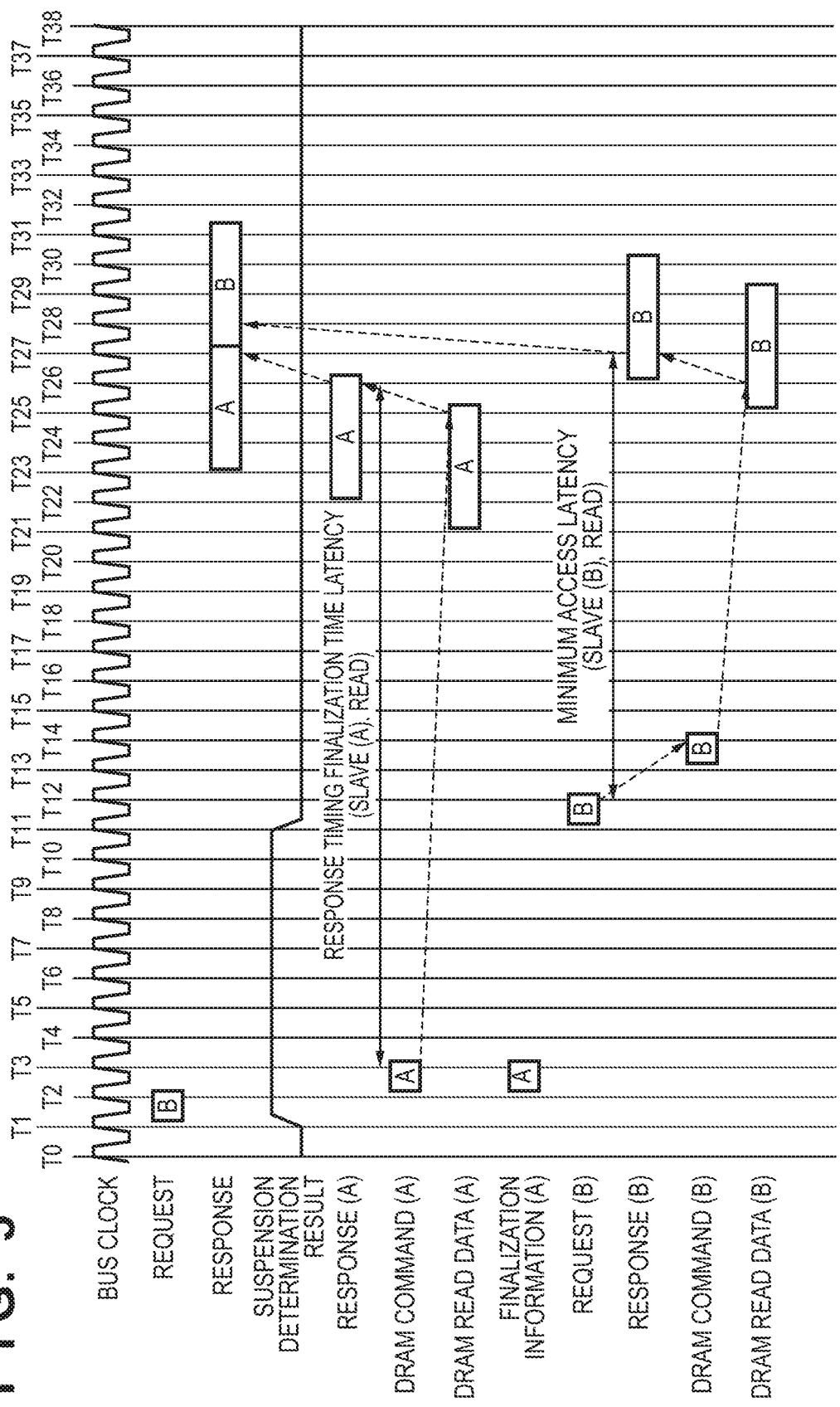
FIG. 5 is a waveform diagram showing behavior of the bus system.

FIG. 5 is a waveform diagram illustrating behavior of the bus system 100 in the first embodiment. FIG. 5 shows a situation in which the master 110 has issued a read request to the slave (A) 120, and before receiving a corresponding response, the master 110 has issued a read request having with the same transfer identifier to the slave (B) 130.

Here, it is assumed that the "response timing finalization time latency" from the time when the slave (A) 120 makes a notification of the finalization information (A) to the time when the bus 140 receives the response (A) is "23 cycles". In addition, it is assumed that the "minimum access latency" which is the shortest time after a request (B) which is a read to the slave (B) 130 is issued and until a response (B) is received by the bus 140 is "15 cycles".

At time T2, the bus 140 receives a read request from the master 110 to the slave (B) 130. However, since a read request with the same transfer identifier has already been issued to the slave (A) 120, the bus 140 asserts a suspension determination result and suspends the transfer of the read request to slave (B) 130.

At time T3, the slave (A) transmits the DRAM command (A) for the preceding read request to the DRAM and notifies the bus 140 of the finalization information (A). The bus 140 changes the status of the corresponding counter to "BUSY" upon receipt of the finalization information (A). Then, "23 cycles" which is the response timing finalization time latency is set in the counter, and the countdown is started.

At time T12, the suspension determining unit 142 determines that the counter value is equal to or less than the minimum access latency (=15 cycles) for a time of a read of the slave (B) 130. Therefore, the bus 140 deasserts the suspension determination result and transfers the read request to the slave (B) 130.

Thus, the master 110 receives a response from the slave (A) during times T24 to T27 and receives a response from the slave (B) during times T28 to T31.

In a case where the bus 140 suspends the issuance of the next request until the response to the preceding request is returned from the slave, the issuance timing of the read request to the slave (B) 130 will be T27. In contrast, according to the present embodiment, a read request to the slave (B) 130 can be issued at T12. Therefore, it is possible to suppress a decrease in data transfer efficiency.

As described above, according to the first embodiment, the transfer of a request from a master to a slave is controlled on the bus. In particular, a suspension period of a subsequent request is determined based on the response timing finalization time latency corresponding to a preceding request and the minimum access latency corresponding to the subsequent request. With this, a decrease in data transfer efficiency is suppressed, and the master 110 can receive responses in an expected order. Also, the bus 140 need not have a large buffer, since a target of a transfer suspension is a request. That is, in a bus system that allows simultaneous (parallel) access to a plurality of slaves, it is possible to realize order guarantee of responses from different slaves with a small circuit scale while suppressing a decrease in data transfer efficiency.

Note that, in the above description, description was made on the assumption that a burst length of requests issued by the master 110 is constant, but the burst length may be different for each request. In this case, it is assumed that the response timing finalization time latency is the latency from when the bus 140 receives finalization information to when the head of a response is received. In addition, a field holding the burst length of the request is added to the request information table 1430. When activating a counter, the response timing measurement unit 1433 sets the value of "response timing finalization time latency+burst length−1" to the counter.

The response timing finalization time latency table held by the suspension determining unit 142 may be divided between the slave (A) 120 and the slave (B). In this case, the finalization information includes a response timing finalization time latency.

Second Embodiment

In the second embodiment, a bus system according to another embodiment according to the present invention will be described. The overall configuration of the bus system is substantially similar to that of the first embodiment (FIG. 1), but the configurations of the slave (A) 120 and the suspension determining unit 142 are different from those of the first embodiment.

Apparatus Configuration

Figure 6:
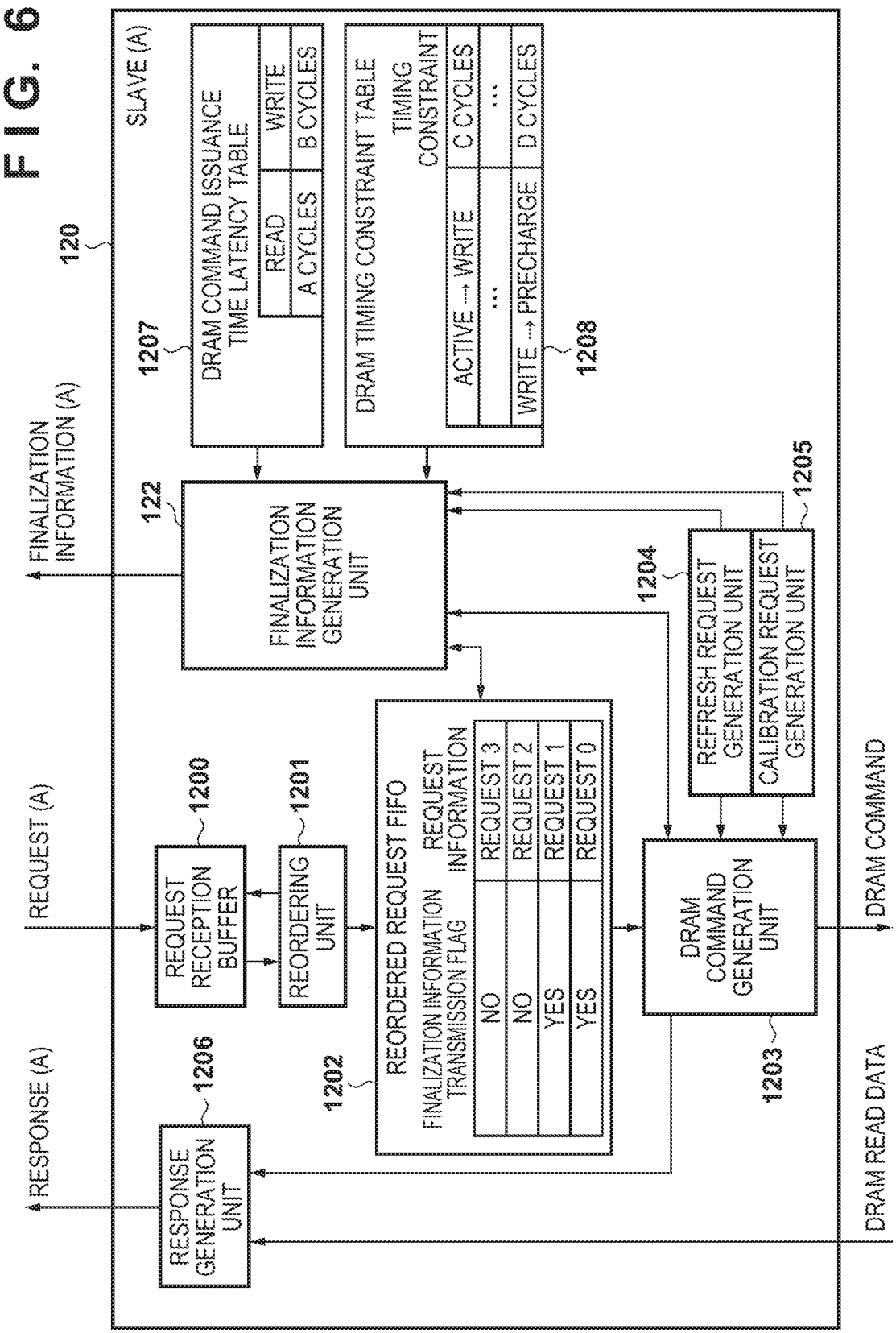
FIG. 6 is a diagram showing a configuration of a slave in a second embodiment.

FIG. 6 is a diagram showing a configuration of a slave in a second embodiment. Here, the configuration of the slave (A) 120 is shown.

The request reception buffer 1200 stores a request received from the bus 140. The reordering unit 1201 fetches a request stored in the request reception buffer 1200 in an order that improves DRAM transfer efficiency and stores the request in the reordered request FIFO 1202. For this reason, the order in which requests are processed is not finalized until they are stored in the reordered request FIFO 1202.

The reordered request FIFO 1202 holds the requests in the order in which they are to be processed. It also has a finalization information transmission flag indicating whether or not finalization information was transmitted with respect to the request of each entry. At the timing when the request is stored in the reordered request FIFO 1202, "NO" is set to indicate that the finalization information transmission flag is unsent.

A DRAM command generation unit 1203 generates a DRAM command from the head request of the reordered request FIFO 1202 and transmits the DRAM command to the DRAM (A) 121. The DRAM command includes an active commands for controlling DRAM pages or a precharge command, and is generated depending on the state of a DRAM bank to be accessed. When the generated and transmitted DRAM command is a write command, the DRAM command generation unit 1203 requests the response generation unit 1206 to generate a write response.

The refresh request generation unit 1204 and the calibration request generation unit 1205 periodically generate a refresh request and a calibration request so that a DRAM standard is satisfied. When such a request is generated, the DRAM command generation unit 1203 transmits the refresh command or calibration command to the DRAM (A) 121 in preference to processing for a request stored in the reordered request FIFO 1202.

Upon receiving DRAM read data from DRAM (A) 121, the response generation unit 1206 generates a read response and transmits the read response to the bus 140. When generation of a write response is requested from the DRAM command generation unit 1203, a write response is generated and transmitted to the bus 140.

A DRAM command issuance time latency table 1207 stores the latency (DRAM command issuance time latency) between when a DRAM command is issued and when a response is returned to the bus 140. A DRAM timing constraint table 1208 stores information about timing constraints between DRAM commands.

The finalization information generation unit 122 selects the oldest entry for which the finalization information transmission flag is "NO" from the reordered request FIFO 1202. It then generates a DRAM command sequence for the selected entry and previously stored entries, arranged in an order for issuing DRAM commands generated from the requests stored in them. The DRAM command sequence is configured from a read command, a write command, an active command, and a precharge command.

Next, the finalization information generation unit 122 generates a DRAM command sequence completion time period indicating the time period until the generated DRAM command sequence is completed. Specifically, the DRAM command sequence completion time period is generated based on the command issuance status for the DRAM timing constraint table 1208 and the DRAM command generation unit 1203. Finally, the finalization information generation unit 122 determines whether or not a refresh request and a calibration request are to be generated within the DRAM command sequence completion time period based on the states of the refresh request generation unit 1204 and the calibration request generation unit 1205.

When a refresh request and a calibration request are to be generated within the DRAM command sequence completion time period, the finalization information generation unit 122 does not notify finalization information to the bus 140. When the refresh request and the calibration request are not to be generated, the finalization information generation unit 122 notifies the bus 140 of finalization information corresponding to the request of the selected entry. The finalization information includes the transfer identifier of the corresponding request, a Dir, and a response timing finalization time latency. Here, the response timing finalization time latency is the sum of DRAM command sequence completion time period and the DRAM command issuance time latency corresponding to the Dir of the request. Further, in a case of notifying the finalization information to the bus 140, the finalization information generation unit 122 updates the finalization information transmission flag of the selected entry to "YES".

Figure 7:
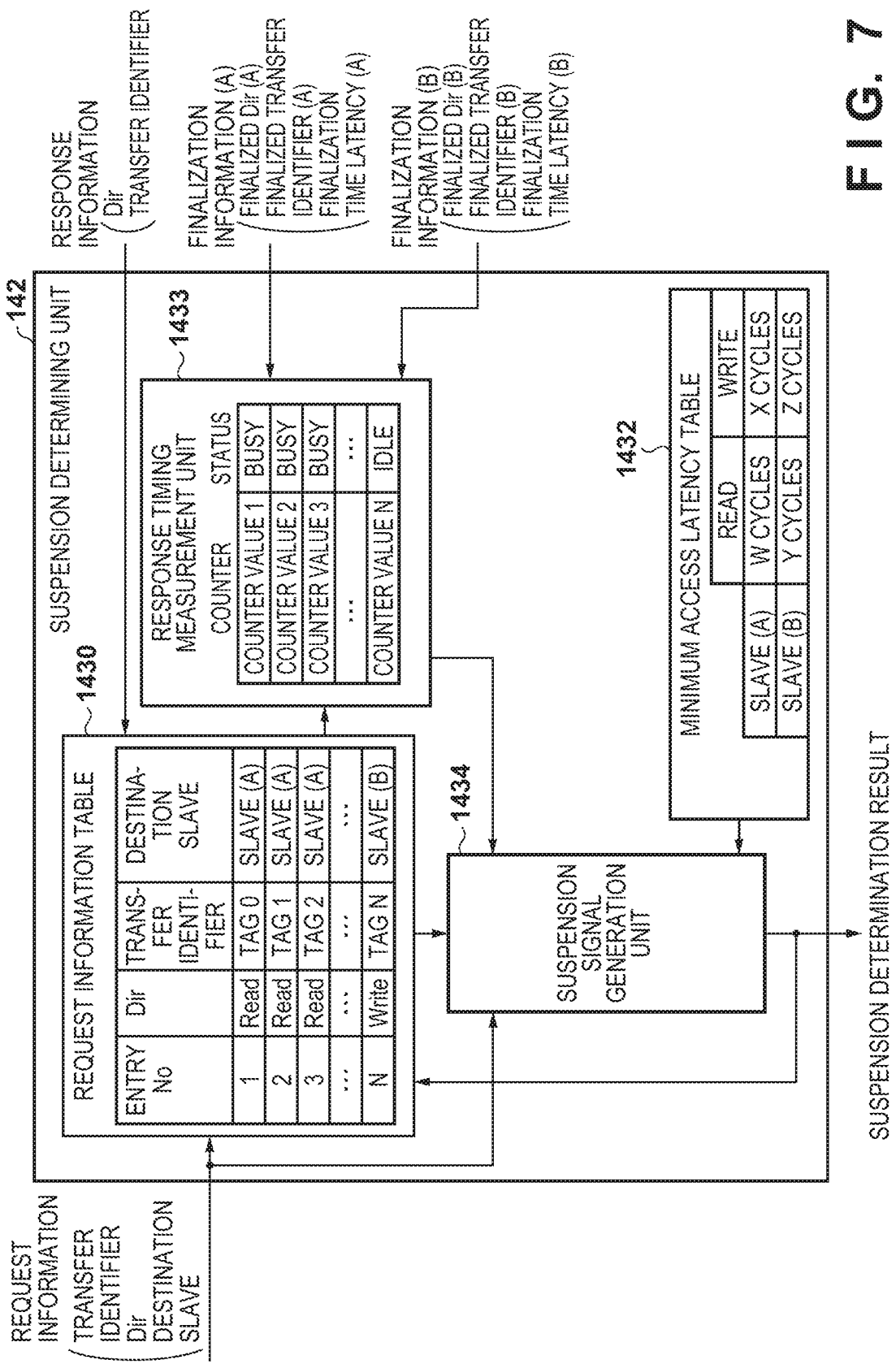
FIG. 7 is a diagram showing a configuration of a suspension determining unit in a second embodiment.

FIG. 7 is a diagram showing a configuration of the suspension determining unit 142 in the second embodiment. As described above, the finalization information in the second embodiment includes the response timing finalization time latency. Therefore, the response timing finalization time latency table 1431 is unnecessary for the suspension determining unit 142. In a case of activating the counter, the response timing measurement unit 1433 sets the response timing finalization time latency included in the finalization information notified from the slave to the counter. Except for the above-mentioned behavior, it is similar to as in the first embodiment, and therefore description is omitted.

As described above, according to the second embodiment, the transfer of a request from a master to a slave is controlled on the bus. Particularly, the finalization information is notified to the bus based on the DRAM command issuance time latency and timing constraints between DRAM commands. With this, a decrease in data transfer efficiency is suppressed, and the master 110 can receive responses in an expected order. Also, the bus 140 need not have a large buffer, since a target of a transfer suspension is a request. That is, in a bus system that allows simultaneous (parallel) access to a plurality of slaves, it is possible to realize order guarantee of responses from different slaves with a small circuit size while suppressing a decrease in data transfer efficiency.

Note that, in the above description, description was made on the assumption that a burst length of requests issued by the master 110 is constant, but the burst length may be different for each request. In such a case, the DRAM command issuance time latency is the latency from when the slave (A) 120 issues a DRAM command until when the start of the response is transmitted to the bus 140. Further, the finalization information generation unit 122 calculates the response timing finalization time latency as "DRAM command sequence completion time period+DRAM command issuance time latency+burst length−1".

Modifications

In the first and second embodiments, description was given regarding a bus system that guarantees the order of responses from different slaves for both reading and writing. However, some configurations may be eliminated so as to guarantee only one of reading and writing, depending on the characteristics of a bus protocol such as a posted write method.

In addition, in a case where, for each slave, the minimum access latency of a slave other than the self slave is uniquely decided, finalization information may be notified to the bus 140 at a timing when the time period until a response is to be returned is less than or equal to the minimum access latency. The bus 140 confirms that all outstanding requests requiring order to be guaranteed have been notified of the finalization information and, if there is a request for which the finalization information not notified, suspends transfer of the request.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-113919, filed Jun. 19, 2019 which is hereby incorporated by reference herein in its entirety.

What is claimed is:

1. A bus system comprising a master, a first slave, a second slave, and a bus operable to connect the master, the first slave, and the second slave, wherein
   the master is configured to issue a second request to the second slave after issuing a first request to the first slave and before receiving a response to the first request,
   the bus includes a processor configured to function as:
      a determination unit configured to, upon receiving the second request, determine whether to permit a transfer of the second request to the second slave; and
      a suspending unit configured to suspend the transfer of the second request to the second slave while it is determined by the determination unit that the transfer is not permitted,
   the first slave is configured to, at a timing when a return timing of a first response for the first request is finalized, transmit finalization information indicating that the first response for the first request is finalized to the determination unit as notification,
   in a case of receiving the finalization information from the first slave, the determination unit calculates a return timing of the first response and a return timing of a second response to the second request based on given information, and
   in a case where it is guaranteed that the return timing of the second response comes after the return timing of the first response, the transfer is permitted.

2. The bus system according to claim 1, wherein the given information comprises:
   first information on a latency from transmission of the finalization information by the first slave until when the first slave is to return the first response, and
   second information on a latency from when the transfer is permitted by the determination unit to until when the second slave is to return the second response.

3. The bus system according to claim 2, wherein the bus further comprises:
   a first storage configured to store the first information; and
   a second storage configured to store the second information.

4. The bus system according to claim 2, wherein the first slave is configured to determine the first information based on third information about the latency from when the first slave starts processing the first request to when the first slave is to return the first response and fourth information about a timing constraint related to the processing, and to transmit the first information to the bus by including the first information in the finalization information, and the bus comprises a storage configured to store the second information.

5. The bus system according to claim 1, wherein the determination unit permits the transfer in a case where it is not necessary to guarantee that a return timing of the response to the second request comes after a return timing of the response to the first request.

6. The bus system according to claim 1, wherein the first slave and the second slave are DRAM controllers, and the first request and the second request are both a read of data from a DRAM, or both a write of data to a DRAM.

7. A method of controlling a bus system comprising a master, a first slave, a second slave, and a bus operable to connect the master, the first slave, and the second slave, the method comprising:

issuing, by the master, a second request to the second slave after issuing a first request to the first slave and before receiving a response to the first request;

determining, by the bus, upon receiving the second request, whether to permit a transfer of the second request to the second slave;

suspending, by the bus, the transfer of the second request to the second slave while it is determined that the transfer is not permitted;

transmitting, by the first slave, at a timing when a return timing of a first response for the first request is finalized, finalization information indicating that the first response for the first request is finalized to the bus as notification;

calculating, by the bus, in a case of receiving the finalization information from the first slave, a return timing of the first response and a return timing of a second response to the second request based on given information; and permitting the transfer in a case where it is guaranteed that the return timing of the second response comes after the return timing of the first response.

* * * * *